(12) United States Patent
Yoshino et al.

(10) Patent No.: US 12,107,067 B2
(45) Date of Patent: Oct. 1, 2024

(54) WIRE BONDING DEVICE, WIRE CUTTING METHOD AND NON-TRANSITORY COMPUTER-READABLE RECORDING MEDIUM RECORDING PROGRAM

(71) Applicant: SHINKAWA LTD., Tokyo (JP)

(72) Inventors: Hiroaki Yoshino, Tokyo (JP); Shinsuke Tei, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 151 days.

(21) Appl. No.: 17/912,527

(22) PCT Filed: Dec. 18, 2020

(86) PCT No.: PCT/JP2020/047415
§ 371 (c)(1),
(2) Date: Sep. 19, 2022

(87) PCT Pub. No.: WO2022/130617
PCT Pub. Date: Jun. 23, 2022

(65) Prior Publication Data
US 2023/0163097 A1    May 25, 2023

(51) Int. Cl.
*H01L 23/00* (2006.01)
*B23K 20/10* (2006.01)
*B23K 101/40* (2006.01)

(52) U.S. Cl.
CPC ............. *H01L 24/78* (2013.01); *B23K 20/10* (2013.01); *H01L 24/85* (2013.01);
(Continued)

(58) Field of Classification Search
CPC .... B23K 20/004; B23K 20/007; B23K 20/10; B23K 2101/40; H01L 21/60;
(Continued)

(56) References Cited

U.S. PATENT DOCUMENTS 5,981,371 A * 11/1999 Yamazaki ............... H01L 24/11
    228/180.5
6,564,453 B2    5/2003 Tamai et al.
(Continued)

FOREIGN PATENT DOCUMENTS

JP    H109252005    9/1997
JP    2723277    3/1998
(Continued)

OTHER PUBLICATIONS

"International Search Report (Form PCT/ISA/210) of PCT/JP2020/047415", mailed on Mar. 16, 2021, with English translation thereof, pp. 1-4.

(Continued)

*Primary Examiner* — Erin B Saad
*Assistant Examiner* — Carlos J Gamino
(74) *Attorney, Agent, or Firm* — JCIPRNET

(57) ABSTRACT

A wire bonding device for performing a wire bonding process includes: a bonding tool for inserting a wire; an ultrasonic vibrator; a drive mechanism for moving the bonding tool; and a control part. The control part performs: a bonding step of bonding the wire to a bonding point; a tail feeding out step of feeding out a wire tail from the wire bonded to the bonding point; a tension applying step of raising the bonding tool to apply tension to the wire while the wire is clamped; a tension release step of lowering the bonding tool to release the tension applied to the wire; and after performing a series of steps including the tension applying step and the tension release step at least once, a tail cutting step of raising the bonding tool to cut the wire tail from the wire.

10 Claims, 14 Drawing Sheets

(52) U.S. Cl.
CPC .......... *B23K 2101/40* (2018.08); *H01L 24/48* (2013.01); *H01L 2224/48465* (2013.01); *H01L 2224/78353* (2013.01); *H01L 2224/7855* (2013.01); *H01L 2224/789* (2013.01); *H01L 2224/85181* (2013.01); *H01L 2224/85205* (2013.01); *H01L 2224/85947* (2013.01)

(58) Field of Classification Search
CPC . H01L 2224/48091; H01L 2224/48465; H01L 2224/78; H01L 2224/78353; H01L 2224/7855; H01L 2224/789; H01L 2224/85181; H01L 2224/85205; H01L 2224/85947; H01L 24/45; H01L 24/48; H01L 24/49; H01L 24/78; H01L 24/85; H01L 2924/00014
See application file for complete search history.

(56) References Cited

U.S. PATENT DOCUMENTS

| | | | | |
|---|---|---|---|---|
| 6,595,400 | B2 * | 7/2003 | Terakado | H01L 24/85 |
| | | | | 228/180.5 |
| 8,919,632 | B2 * | 12/2014 | Liu | B23K 3/08 |
| | | | | 228/103 |
| 9,887,174 | B2 * | 2/2018 | Sekine | H01L 24/85 |
| 11,450,640 | B2 | 9/2022 | Tei | |
| 2007/0246513 | A1 * | 10/2007 | Tei | H01L 24/78 |
| | | | | 228/101 |
| 2008/0197510 | A1 * | 8/2008 | Mii | B23K 20/004 |
| | | | | 257/E23.024 |
| 2011/0180590 | A1 * | 7/2011 | Akiyama | H01L 24/85 |
| | | | | 228/103 |
| 2016/0351537 | A1 * | 12/2016 | Sekine | H01L 24/85 |
| 2016/0358883 | A1 * | 12/2016 | Yoshino | H01L 25/10 |
| 2024/0006193 | A1 * | 1/2024 | Yoshino | H01L 21/603 |

FOREIGN PATENT DOCUMENTS

| | | |
|---|---|---|
| JP | 2007294581 | 11/2007 |
| TW | 522497 | 3/2003 |
| TW | 201841273 | 11/2018 |
| WO | 2015122410 | 8/2015 |

OTHER PUBLICATIONS

"Office Action of Taiwan Counterpart Application," issued on Mar. 23, 2023, with partial English translation thereof, p. 1-p. 17.

"Office Action of Korea Counterpart Application", issued on Apr. 17, 2024, with English translation thereof, p. 1-p. 18.

* cited by examiner

WIRE BONDING DEVICE, WIRE CUTTING METHOD AND NON-TRANSITORY COMPUTER-READABLE RECORDING MEDIUM RECORDING PROGRAM

CROSS-REFERENCE TO RELATED APPLICATION

This application is a 371 application of the International PCT application serial no. PCT/JP2020/047415, filed on Dec. 18, 2020. The entirety of the above-mentioned patent application is hereby incorporated by reference herein and made a part of this specification.

TECHNICAL FIELD

The disclosure relates to a wire bonding device, a wire cutting method and a non-transitory computer-readable recording medium recording a program.

RELATED ART

Conventionally, known is a wire bonding device in which a first bonding point (for example, a pad of a semiconductor die) and a second bonding point (for example, a lead of a package) are electrically connected by a wire. Depending on the bonding conditions of the wire bonding device, the shape of the bonding end part, which is the connection part between the lower end of the wire tail and the electrode pad (which is the second bonding point), may not be thin. In this case, when the wire is gripped by the clamper and the wire tail is pulled up, a large tension is applied to the wire tail, whereby the wire tail is in a stretched state. Then, after the wire tail is further pulled up, the wire tail is cut at the bonding end part. At this time, the stretched wire tail jumps up due to the reaction force at the time of cutting. This causes the wire and the wire tail at the lower part of the clamper to bend in an S shape. The bent wire tail may cause poor ball formation by electric discharge or the like during the next bonding to the electrode pad. Therefore, a method for cutting a wire tail that does not cause bending of the wire tail has been proposed.

CITATION LIST

Patent Literature

[Patent Literature 1] Japanese Patent Lain-Open No. 2723277

SUMMARY

Technical Problem

The wire bonding method disclosed in Patent Literature 1 raises the capillary diagonally upward from the bonding position after bonding so that the wire tail led out to the tip end of the capillary does not bend. However, in the wire bonding method, if the bonding end part which is the connection part between the lower end of the tail wire and the electrode pad is not thin enough, a large tensile force is applied to the wire when the wire tail is cut. In this case, in the wire bonding method, the wire may jump up due to the reaction force at the time of cutting the wire tail, and the wire at the lower part of the clamper and the wire tail may bend in an S shape.

Therefore, the disclosure has been made in view of the above, and the disclosure cuts the wire tail without applying a large tensile force to prevent bending of the wire when the wire tail is cut.

Solution to Problem

A wire bonding device according to an embodiment of the disclosure is a wire bonding device for performing a wire bonding process. The wire bonding device includes: a bonding tool for inserting a wire; an ultrasonic vibrator for supplying ultrasonic vibration to the bonding tool via an ultrasonic horn; a drive mechanism for moving the bonding tool; and a control part for controlling the wire bonding process. The control part performs: a bonding step of bonding the wire to a bonding point which is a bonding target by pressing the wire with the bonding tool; a tail feeding out step of feeding out a wire tail from the wire bonded to the bonding point; a tension applying step of raising the bonding tool to apply tension to the wire while the wire is clamped; a tension release step of lowering the bonding tool to release the tension applied to the wire; and after performing a series of steps comprising the tension applying step and the tension release step at least once, a tail cutting step of raising the bonding tool to cut the wire tail from the wire bonded to the bonding point.

A wire cutting method according to an embodiment of the disclosure is a wire bonding method performed by using a wire bonding device for performing a wire bonding process. The wire bonding device includes: a bonding tool for inserting a wire; an ultrasonic vibrator for supplying ultrasonic vibration to the bonding tool via an ultrasonic horn; a drive mechanism for moving the bonding tool; and a control part for controlling the wire bonding process. The wire cutting method includes: a bonding step of bonding the wire to a bonding point which is a bonding target by pressing the wire with the bonding tool; a tail feeding out step of feeding out a wire tail from the wire bonded to the bonding point; a tension applying step of raising the bonding tool to apply tension to the wire while the wire is clamped; a tension release step of lowering the bonding tool to release the tension applied to the wire; and after performing a series of steps comprising the tension applying step and the tension release step at least once, a tail cutting step of raising the bonding tool to cut the wire tail from the wire bonded to the bonding point.

A non-transitory computer-readable recording medium recording a program according to an embodiment of the disclosure is one that records a program for causing a wire bonding device to perform a wire bonding process. The wire bonding device includes: a bonding tool for inserting a wire; an ultrasonic vibrator for supplying ultrasonic vibration to the bonding tool via an ultrasonic horn; a drive mechanism for moving the bonding tool; and a control part for controlling the wire bonding process. The program causes the wire bonding device to perform: a bonding step of bonding the wire to a bonding point which is a bonding target by pressing the wire with the bonding tool; a tail feeding out step of feeding out a wire tail from the wire bonded to the bonding point; a tension applying step of raising the bonding tool to apply tension to the wire while the wire is clamped; a tension release step of lowering the bonding tool to release the tension applied to the wire; and after performing a series of steps comprising the tension applying step and the tension release step at least once, a tail cutting step of raising the bonding tool to cut the wire tail from the wire bonded to the bonding point.

Effects of Invention

According to the disclosure, the wire tail may be cut without a large tensile force being applied to prevent bending of the wire when the wire tail is cut.

DESCRIPTION OF THE EMBODIMENTS

Figure 1:
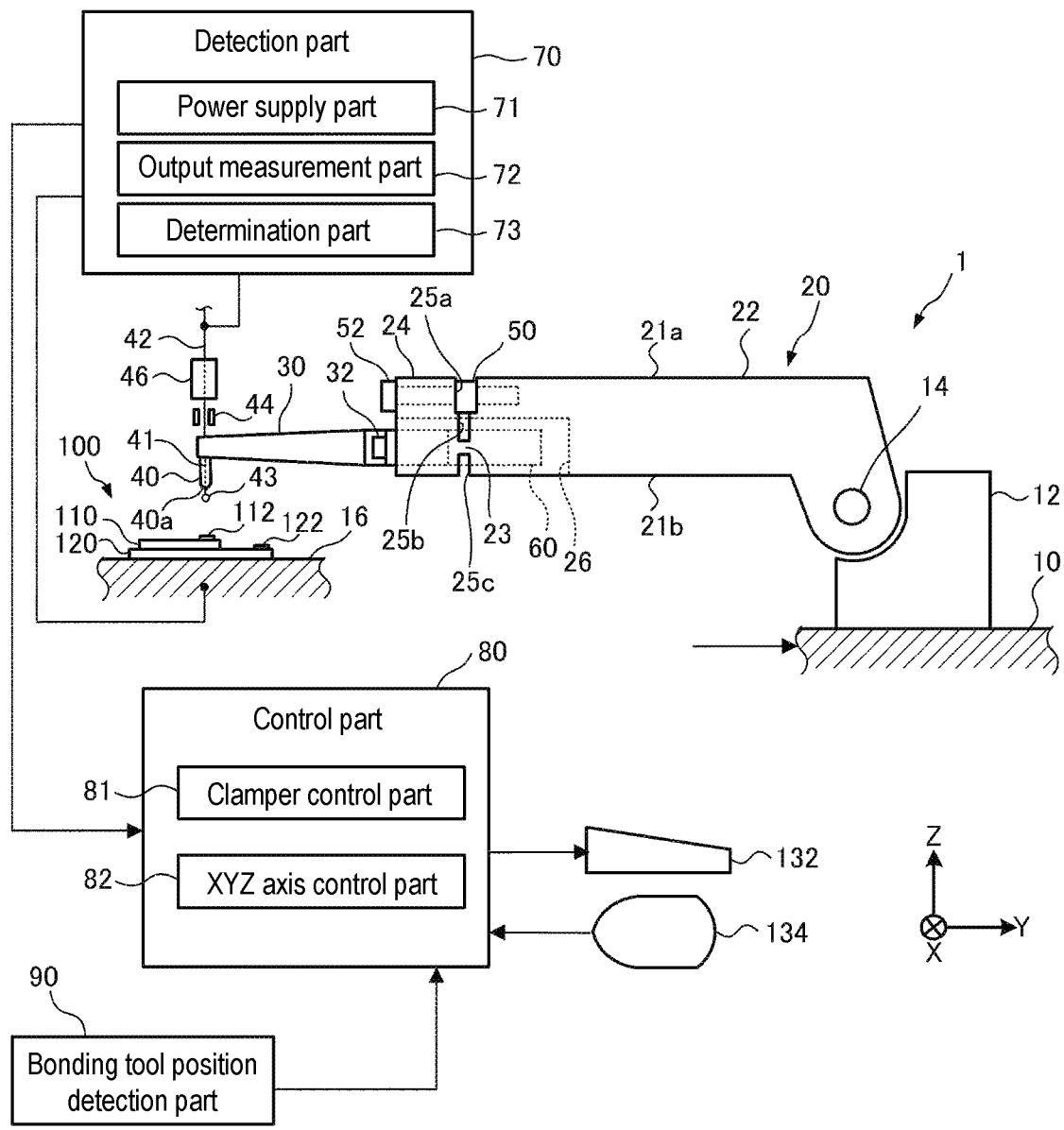
FIG. 1 is a view showing an example of the wire bonding device according to the embodiment.

Embodiments of the disclosure will be described below. In the description of the drawings below, the same or similar components are denoted by the same or similar reference numerals. The drawings are examples, and the dimensions and shapes of each part are schematic, and the technical scope of the disclosure should not be limited to the embodiments.

Figure 2A:
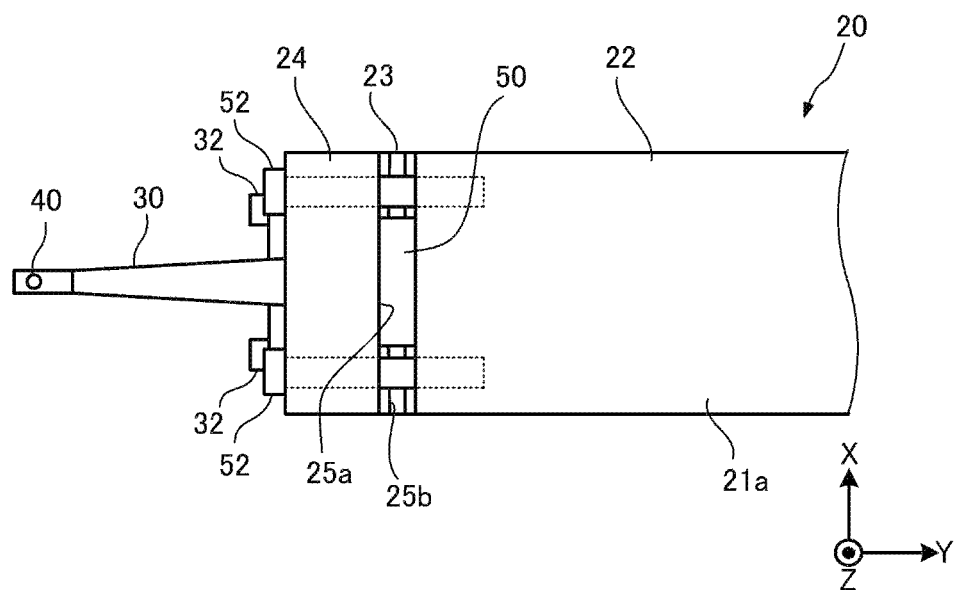
FIG. 2A is a top view of a bonding arm.
Figure 2B:
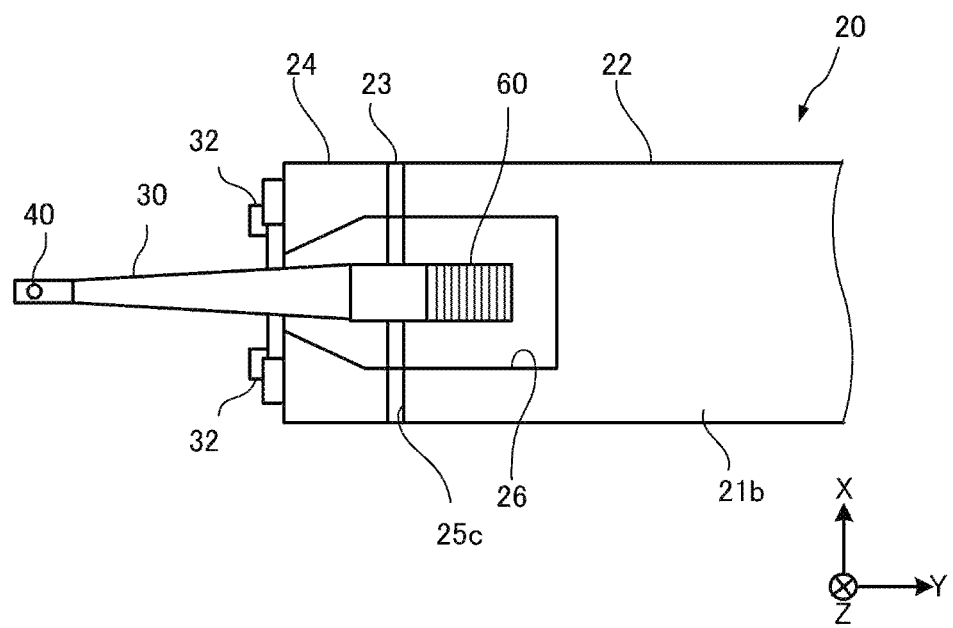
FIG. 2B is a bottom view of the bonding arm.
Figure 3:
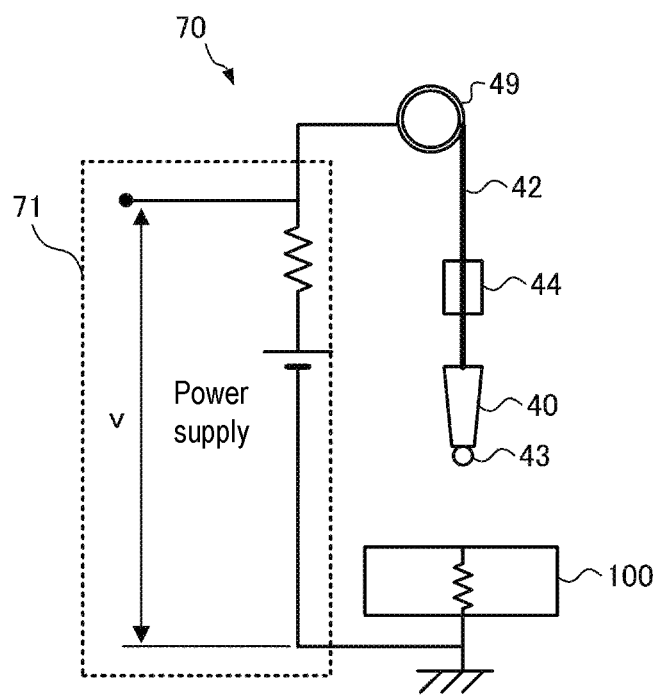
FIG. 3 is a view showing an example of an outline of a detection part.
Figure 4:
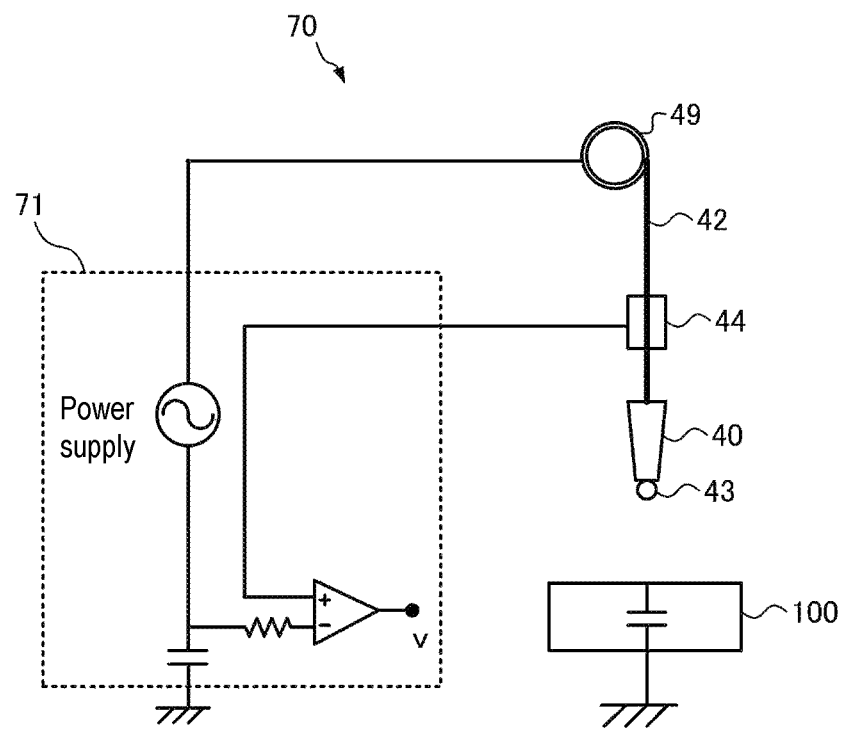
FIG. 4 is a view showing another example of an outline of the detection part.

[Configuration of Wire Bonding Device 1] The wire bonding device 1 will be described with reference to FIGS. 1 to 4. FIG. 1 is a view showing an example of the wire bonding device 1 according to the embodiment. FIG. 2A is a top view of a bonding arm 20. FIG. 2B is a bottom view of the bonding arm 20. FIG. 3 is a view showing an example of an outline of a detection part 70. FIG. 4 is a view showing another example of an outline of the detection part 70.

As shown in FIG. 1, the wire bonding device 1 includes, for example, an XY drive mechanism 10, a Z drive mechanism 12, the bonding arm 20, an ultrasonic horn 30, a bonding tool 40, a load sensor 50, an ultrasonic vibrator 60, the detection part 70, a control part 80, and a bonding tool position detection part 90.

The XY drive mechanism 10 is configured to be movable in the XY axis direction (direction parallel to the bonding surface), for example. The XY drive mechanism 10 is provided with, for example, the Z drive mechanism 12 capable of moving the bonding arm 20 in the Z-axis direction (direction perpendicular to the bonding surface).

The bonding arm 20 is supported by a support shaft 14 and is configured to be swingable with respect to the XY drive mechanism 10. The bonding arm 20 is formed in a substantially rectangular parallelepiped to extend from the XY drive mechanism 10 toward a bonding stage 16 on which a semiconductor device 100 to be bonded is placed. The bonding arm 20 includes an arm base end part 22 attached to the XY drive mechanism 10, an arm tip end part 24 located on the tip end side (−Y direction side) of the arm base end part 22 and to which the ultrasonic horn 30 is attached, and a flexible connection part 23 that connects the arm base end part 22 and the arm tip end part 24. The connection part 23 is configured by, for example, slits 25a and 25b having a predetermined width extending from a top surface 21a toward a bottom surface 21b of the bonding arm 20, and a slit 25c having a predetermined width extending from the bottom surface 21b toward the top surface 21a of the bonding arm 20. In this way, the connection part 23 is locally configured as a thin-walled part by the slits 25a, 25b, and 25c, so that the arm tip end part 24 may be bent with respect to the arm base end part 22.

As shown in FIGS. 1 and 2B, a recess 26 in which the ultrasonic horn 30 is housed is formed on the bottom surface 21b side of the bonding arm 20. The ultrasonic horn 30 is attached to the arm tip end part 24 by a horn fixing screw 32 in a state of being housed in the recess 26 of the bonding arm 20. The ultrasonic horn 30 holds the bonding tool 40 at a tip end part protruding from the recess 26, and the recess 26 is provided with the ultrasonic vibrator 60 that generates ultrasonic vibration. Ultrasonic vibration is generated by the ultrasonic vibrator 60, and it is transmitted to the bonding tool 40 by the ultrasonic horn 30. As a result, the ultrasonic vibrator 60 may apply ultrasonic vibration to the bonding target via the bonding tool 40. The ultrasonic vibrator 60 is, for example, a piezo vibrator.

Further, as shown in FIGS. 1 and 2A, the slits 25a and 25b are formed in order from the top surface 21a toward the bottom surface 21b on the top surface 21a side of the bonding arm 20. The upper slit 25a is formed wider than the lower slit 25b. The load sensor 50 is provided in the upper slit 25a that is formed wider. The load sensor 50 is fixed to the arm tip end part 24 by a preload screw 52. The load sensor 50 is disposed to be sandwiched between the arm base end part 22 and the arm tip end part 24. That is, the load sensor 50 is mounted between the rotation center of the bonding arm 20 and the mounting surface of the ultrasonic horn 30 at the arm tip end part 24 (that is, the tip end surface of the arm tip end part 24 on the bonding tool 40 side) to be offset from the central axis in the longitudinal direction of the ultrasonic horn 30 in the contact/separation direction with respect to the bonding target. Then, as described above, since the ultrasonic horn 30 holding the bonding tool 40 is attached to the arm tip end part 24, when a load is applied to the tip end of the bonding tool 40 by the reaction force from the bonding target, the arm tip end part 24 bends with respect to the arm tip end part 22, and the load sensor 50 may detect the load. The load sensor 50 is, for example, a piezo load sensor.

The bonding tool 40 is for inserting a wire 42, and is, for example, a capillary provided with an insertion hole 41. The wire 42 used for bonding is inserted into the insertion hole 41 of the bonding tool 40. The bonding tool 40 is configured so that a part of the wire 42 may be fed out from the tip end thereof. Hereinafter, for convenience of description, the wire 42 fed out from the tip end of the bonding tool 40 is referred to as a wire tail 42a. Further, a pressing part 40a for pressing the wire 42 is provided at the tip end of the bonding tool 40. The pressing part 40a has a rotationally symmetric shape around the insertion hole 41 of the bonding tool 40 in the axial direction, and has a pressing surface on the lower surface around the insertion hole 41. The bonding tool 40 is attached to the ultrasonic horn 30 to be replaceable by a spring force or the like.

A clamper 44 is provided above the bonding tool 40, for example, and operates together with the bonding tool 40. The clamper 44 is configured to grip (constrain) or release the wire 42 at a predetermined timing based on, for example, a control signal output from a clamper control part 81. A wire tensioner (not shown) may be provided above the clamper 44. The wire tensioner is configured to, for example, insert the wire 42 and apply an appropriate tension to the wire 42 during bonding.

The material of the wire 42 is appropriately selected from the viewpoint of ease of processing, low electrical resistance, and the like, and for example, gold (Au), aluminum (Al), copper (Cu), silver (Ag), or the like is used. The wire 42 forms a ball part 43 extending from the tip end of the bonding tool 40. The ball part 43 is bonded to a predetermined bonding point (for example, an electrode pad 112, hereinafter referred to as a first bonding point).

The detection part 70 electrically detects, for example, whether the ball part 43 formed at the tip end of the wire 42 inserted into the bonding tool 40 is grounded to the semiconductor device 100 which is the bonding target. Further, the detection part 70 detects, for example, whether the wire tail 42a is cut from a predetermined bonding point of the semiconductor device 100 (for example, an electrode pad 122, hereinafter referred to as a second bonding point) based on an output of an electric signal supplied to the wire 42.

The detection part 70 includes, for example, a power supply part 71, an output measurement part 72, and a determination part 73. The power supply part 71 applies a predetermined electric signal between the semiconductor device 100 and the wire 42, for example. The output measurement part 72 measures, for example, the output of an electric signal supplied by the power supply part 71. The determination part 73 determines whether the wire 42 has electrically contacted the semiconductor device 100, for example, based on the measurement result of the output measurement part 72. As shown in FIG. 1, in the detection part 70, one terminal is electrically connected to the bonding stage 16, and the other terminal is electrically connected to the clamper 44 (or a wire spool (omitted in FIG. 1)).

As shown in FIG. 3, the power supply part 71 of the detection part 70 may be configured by a DC voltage power supply. That is, when it is considered that the bonding point of the semiconductor device 100 and the bonding stage 16 are connected only by the resistance component (for example, when both are electrically conductive), the detection part 70 may use the DC voltage signal as a predetermined electric signal. In this case, when the ball part 43 of the wire 42 comes into contact with the bonding point of the semiconductor device 100, an electrical short circuit occurs between the bonding stage 16 and the wire 42. The detection part 70 may determine whether the ball part 43 has come into contact with the electrode pad 122, which is the second bonding point of the semiconductor device 100, based on the change in the presence or absence of this electrical short circuit (for example, the change in the output voltage v). In other words, the detection part 70 may detect whether the wire tail 42a is cut from the second bonding point of the semiconductor device 100.

As shown in FIG. 4, the power supply part 71 of the detection part 70 may be configured by an AC voltage power supply. That is, when the bonding point of the semiconductor device 100 and the bonding stage 16 include a capacitive component (for example, when the two are not electrically conductive), an AC voltage signal may be used as a predetermined electric signal. In this case, when the ball part 43 of the wire 42 comes into contact with the bonding point of the semiconductor device 100, the capacitance value of the semiconductor device 100 is further added to the capacitance value of the wire bonding device 1. As a result, capacitance value between the bonding stage 16 and the wire 42 changes. Therefore, the detection part 70 may determine whether the ball part 43 has come into contact with the electrode pad which is the second bonding point of the semiconductor device 100 based on the change in the capacitance value (for example, the change in the output voltage v). In other words, the detection part 70 may detect whether the wire tail 42a is cut from the second bonding point of the semiconductor device 100.

With reference back to FIG. 1, the bonding tool position detection part 90 detects, for example, the position of the bonding tool 40 including the position of the bonding tool 40 in the Z-axis direction (for example, the position of the tip end of the bonding tool 40). The bonding tool position detection part 90 outputs information regarding the detection result (hereinafter referred to as detection result information) to the control part 80.

The control part 80 includes, for example, a clamper control part 81 and an XYZ axis control part 82. The clamper control part 81 controls the opening and closing operation of the clamper 44. The XYZ axis control part 82 controls the operation in the X-axis direction, the Y-axis direction, and the Z-axis direction in the bonding tool 40.

The control part 80 is connected to be able to transmit and receive signals to and from each configuration such as the XY drive mechanism 10, the Z drive mechanism 12, the ultrasonic horn 30 (ultrasonic vibrator 60), the clamper 44, the load sensor 50, the detection part 70, the bonding tool position detection part 90, and the like. By controlling the operation of these configurations, the control part 80 may perform a process of cutting the wire tail 42a so as not to cause bending of the wire tail 42a in the wire bonding.

The control part 80 raises and lowers the bonding tool 40 in the Z-axis direction based on the detection result information output from the bonding tool position detection part 90. After bonding the wire 42 to the second bonding point, the control part 80 applies tension to the wire 42 by raising the bonding tool 40 in the Z-axis direction (hereinafter referred to as a tension applying step). That is, the control part 80 applies stress to the connection part between the wire tail 42a and the second bonding point. After that, the control part 80 releases the tension applied to the wire 42 by lowering the bonding tool 40 in the Z-axis direction (hereinafter referred to as a tension release step). That is, the control part 80 releases the stress at the connection part between the wire tail 42a and the second bonding point.

The control part 80 determines, for example, the moving direction and the height of raising the tip end of the bonding tool 40 in the tension applying step based on preset information on raising (hereinafter referred to as raising information). Similarly, the control part 80 determines, for example, the moving direction and the height of lowering the tip end of the bonding tool 40 in the tension release step based on preset information on lowering (hereinafter referred to as lowering information). Here, the height of the tip end of the bonding tool 40 means a distance from a predetermined reference point, and the predetermined reference point is not particularly limited and may be, for example, the second bonding point. In the above description, it has been described that the control part 80 determines the height of the tip end of the bonding tool 40 based on the raising information or the lowering information, but the disclosure is not limited thereto. For example, the control part 80 may determine the moving distance of the tip end of the bonding tool 40 based on the raising information or the lowering information. Specifically, as an example, the control part 80 may determine in the tension applying step the moving distance that is raised in the Z-axis direction from the second bonding point, or may determine in the tension release step the moving distance that is lowered in the Z-axis direction from the end point that has been raised in the tension applying step. Hereinafter, for convenience of description, the raising height or moving distance of the tip end of the bonding tool 40 may be referred to as the "raising moving amount," and the lowering height or moving distance may be referred to as the "lowering moving amount."

Here, the raising moving direction is, for example, a direction away from the second bonding point, and is preferably the Z-axis direction. The lowering moving direction is, for example, a direction approaching the second bonding point, and is preferably a direction along the raising moving direction. However, when the raising moving direction and the lowering moving direction are angled with respect to the Z-axis direction, stress in the X-axis direction or the Y-axis direction may be applied to the lower end of the wire tail 42a. As a result, the wire tail 42a may be cut with a small tensile force as described later. Here, the start point in the raising moving direction may be, for example, the second bonding point or a point deviated from the second bonding point in the XY plane. As a result, stress in the X-axis direction or the Y-axis direction may be applied to the lower end of the wire tail 42a, so that the wire tail 42a may be cut with a small tensile force as described later. Further, the start point in the lowering moving direction may be, for example, the end point of the tension applying step. Hereinafter, for convenience of description, in the control part 80, the raising moving direction and the lowering moving direction are set in the Z-axis direction; the start point of the starting raising moving direction is set as the second bonding point; and the start point of the starting lowering moving direction is set as the end point of the tension applying step.

Further, the control part 80 may automatically set the height or the moving distance (moving amount) in the tension applying step and the tension release step based on the thickness of the wire 42, for example. Specifically, the control part 80 may set, for example, a predetermined ratio (for example, 60%) to the thickness of the wire 42 as the raising moving amount. The control part 80 may set a predetermined ratio (for example, 30%) to the thickness of the wire 42 as the lowering moving amount. Further, the control part 80 may automatically set the lowering moving amount in the tension release step based on, for example, the raising information. Specifically, the control part 80 may set a predetermined ratio (for example, 50%) to the raising moving amount as the lowering moving amount. Furthermore, the control part 80 may automatically set, for example, the raising moving amount of the tension applying step and the lowering moving amount of the tension release step based on the material of the wire 42 in addition to the thickness of the wire 42. Specifically, for example, the control part 80 may set the raising moving amount to be larger and the lowering moving amount to be smaller when the material of the wire 42 is harder. This is because the stronger the strength of the wire 42, the less bending deformation occurs even if a large tension is applied. As a result, the amount of work required for setting of the operator may be reduced.

Further, the control part 80 sets so that, for example, the raising moving amount in the tension applying step is larger than the lowering moving amount in the tension release step. Then, it is preferable that the control part 80 repeats, for example, the tension applying step and the tension release step multiple times. That is, in the control part 80 sets so that, for example, the height of the tip end of the bonding tool 40 in the current tension applying step (the second tension applying step described later) is higher than the height of the tip end of the bonding tool 40 in the previous tension applying step (the first tension applying step described later). In this way, the control part 80 repeats the tension applying step and the tension release step, so that metal fatigue is gradually caused in the part between the lower end of the wire tail 42a (the end in the −Z axis direction) and the end of the wire 42 connected to the second bonding point in a thinly crushed shape (hereinafter referred to as a bonding end part 42c). That is, the tensile strength at the part between the lower end of the wire tail 42a and the bonding end part 42c is reduced. As a result, the wire tail 42a may be cut from the second bonding point without applying a large tensile force to the part. In other words, the connection part between the wire tail 42a and the second bonding point is gradually thinned, and the wire tail 42a may be cut with a small pulling force at the time of cutting. As a result, the wire tail 42a is not bent and deformed, and the bonding quality may be improved.

Further, the control part 80, for example, stops a series of steps including the tension applying step and the tension release step when the detection part 70 detects that the wire tail 42a is cut from the second bonding point of the semiconductor device 100. As a result, the tension applying step and the tension release step may be performed a minimum number of times, so the time of the cutting step of the wire tail 42a may be shortened. Further, since it is not necessary to set the number of times of the tension applying step and the tension release step, the amount of work of the operator may be reduced.

The control part 80 is connected to, for example, an operation part 132 for inputting information for control (hereinafter referred to as control information) and a display part 134 for outputting the control information. The operator confirms the screen on the display part 134, and inputs control information (raising information, lowering information, and the like) by the operation part 132. The control part 80 is a computer device including a CPU, a memory, and the like, and the memory stores a program and the like for executing processing necessary for wire bonding in advance. The control part 80 is configured to perform each step for controlling the operation of the bonding tool 40 described in the wire bonding method described later (for example, includes a program for causing a computer to execute each step).

[Wire Bonding Method]

Figure 5:
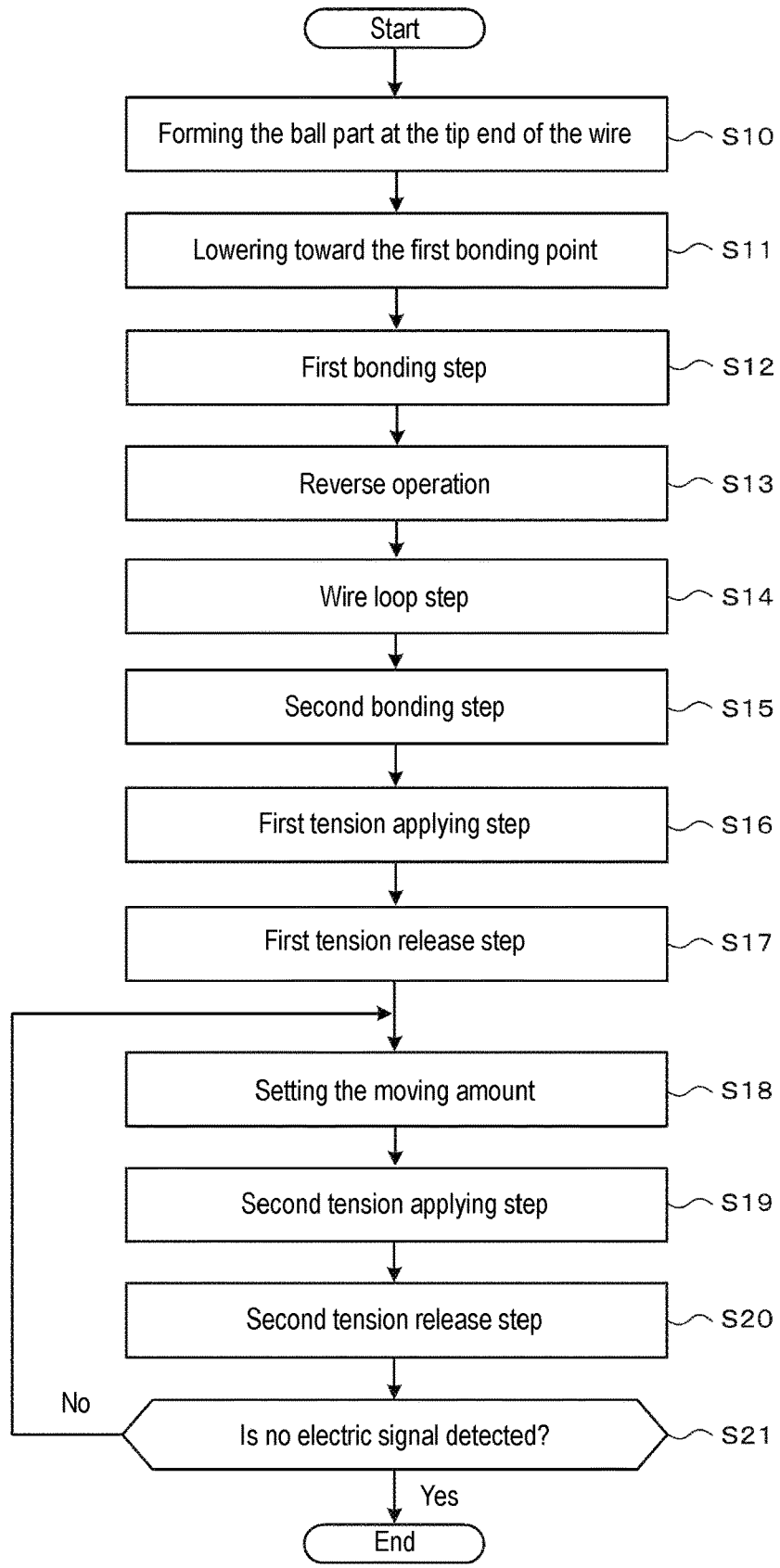
FIG. 5 is a flowchart showing an example of the wire bonding method.
Figure 7:
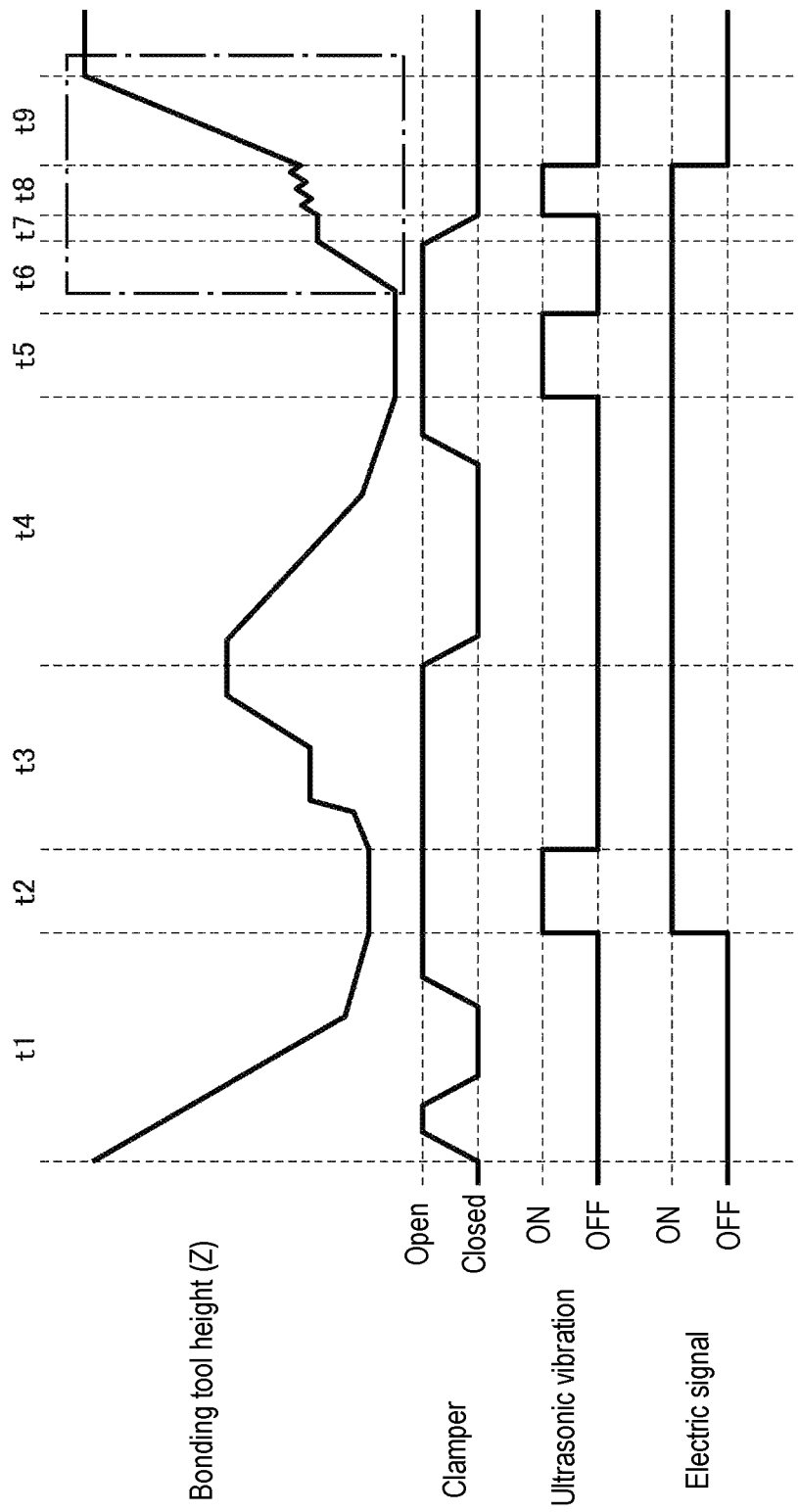
FIG. 7 is an example of a timing chart showing each step.
Figure 8:
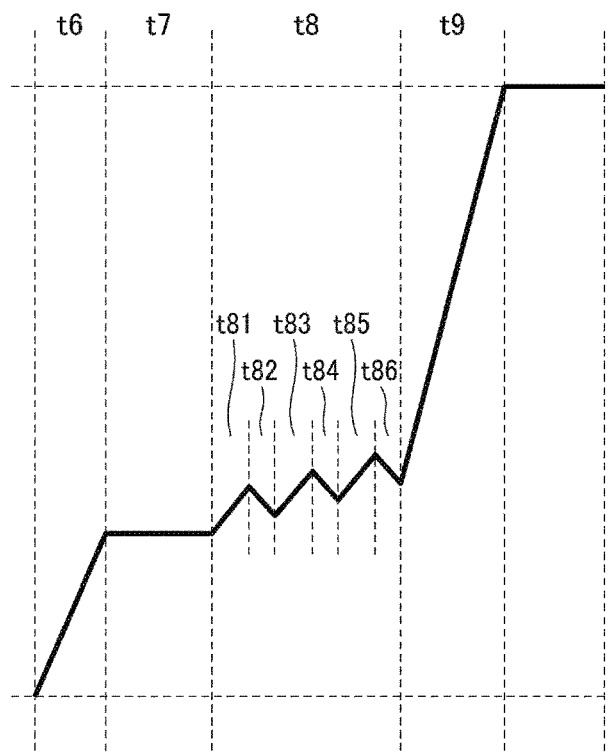
FIG. 8 is an example of a detailed timing chart of the tension applying step and the tension release step.

Next, the wire bonding method will be described with reference to FIGS. 5 to 8. The wire bonding method is a method using a wire bonding method using the wire bonding device 1. FIG. 5 is a flowchart showing an example of the wire bonding method. FIGS. 6A to 6L are views showing an example of the operation of each step. FIG. 7 is a timing chart showing each step. The times t1 to t9 in FIGS. 6A to 6L correspond to the times t1 to t9 in FIG. 7. FIG. 8 is a timing chart showing a detailed example of the tension applying step and the tension release step.

Figure 6A:
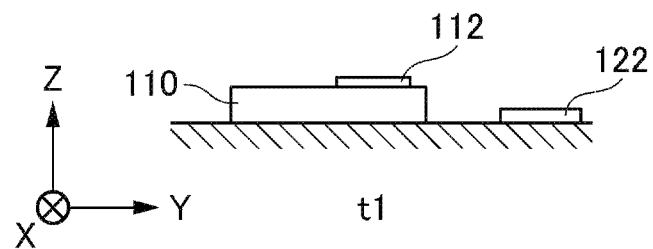
FIG. 6A is a view showing an example of an operation of forming a ball part.

In step S10 (time t1), as shown in FIG. 6A, the wire bonding device 1 forms the ball part 43 at the tip end of the wire 42 extending from the tip end of the bonding tool 40. In step S10, the clamper 44 is, for example, in an open state.

In step S11 (time t1), the wire bonding device 1 lowers the bonding tool 40 toward the electrode pad 112 of a semiconductor die 110. In step S11, the clamper 44 is, for example, in a closed state.

Figure 6B:
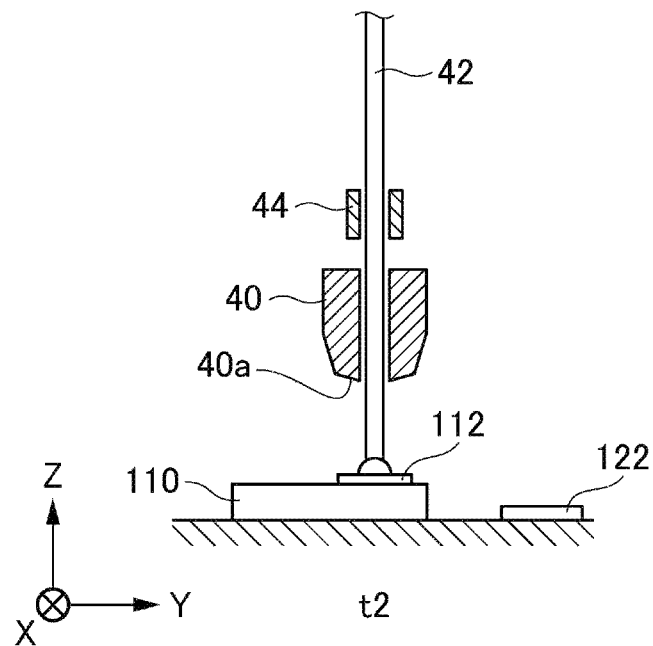
FIG. 6B is a view showing an example of an operation of bringing the ball part into contact with the electrode pad.

In step S12 (time t2), as shown in FIG. 6B, the wire bonding device 1 brings the ball part 43 into contact with the electrode pad 112. Then, the wire bonding device 1 keeps the clamper 44 open and turns on the ultrasonic vibration (first bonding step). As a result, the ball part 43 is bonded to the electrode pad 112. The wire bonding device 1 feeds out the wire 42 from the tip end of the bonding tool 40 while raising the tip end of the bonding tool 40 in the Z-axis direction. In step S12, the detection part 70 detects an electric signal. At this time, the clamper 44 is in an open state.

Figure 6C:
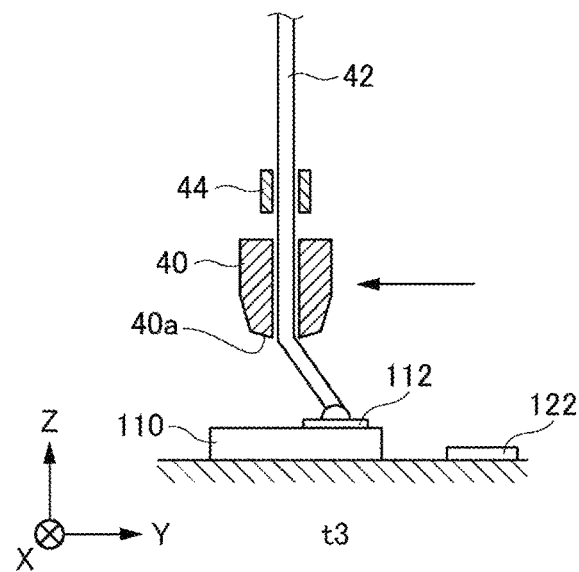
FIG. 6C is a view showing an example of a reverse operation.

In step S13 (time t3), as shown in FIG. 6C, the wire bonding device 1 operates the wire 42 on the side opposite to the second bonding point (here, the electrode pad 122) (in the direction of the "arrow" in FIG. 6C) (reverse operation). As a result, the wire 42 exhibits a bent shape.

Figure 6D:
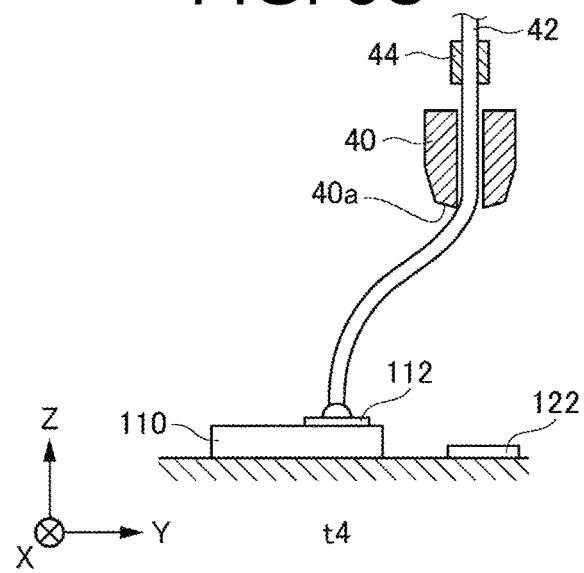
FIG. 6D is a view showing an example of an operation of a wire loop step.

In step S14 (time t4), as shown in FIG. 6D, the wire bonding device 1 forms a wire loop of the wire 42 while bending the wire 42 toward the second bonding point (wire loop step). Then, the wire bonding device 1 brings a part of the wire 42 into contact with the upper surface of the electrode pad 122. As a result, a wire loop (not shown) that electrically connects the electrode pad 112, which is the first bonding point, and the electrode pad 122, which is the second bonding point, is formed. In step S14, the clamper 44 is in the closed state.

Figure 6E:
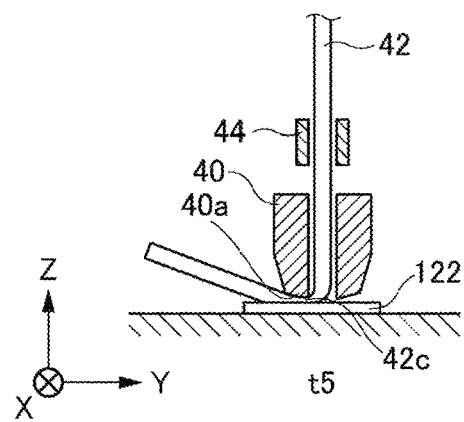
FIG. 6E is a view showing an example of an operation of pressing a part of a wire against an electrode pad.

In step S15 (time t5), as shown in FIG. 6E, the wire bonding device 1 presses a part of the wire 42 against the electrode pad 122 by the pressing part 40a of the bonding tool 40. The wire bonding device 1 turns on the ultrasonic vibration and bonds a part of the wire 42 to the electrode pad 122 (second bonding step). At this time, the bonding end part 42c in a thinly crushed shape is formed at the end part of the wire 42 connected to the electrode pad 122.

Figure 6F:
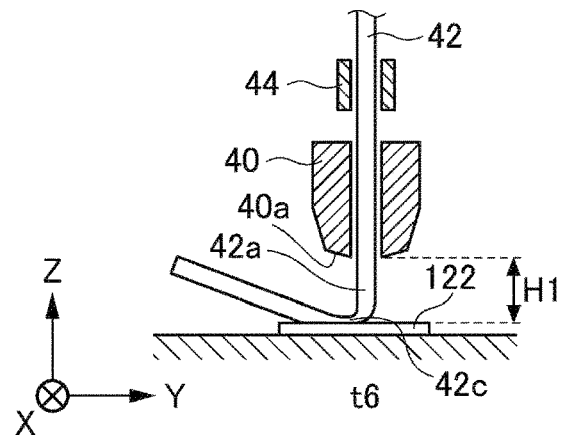
FIG. 6F is a view showing an example of an operation of feeding out a wire.

At time t6, as shown in FIG. 6F, the wire bonding device 1 raises the tip end of the bonding tool 40 in the Z-axis direction and feeds out the wire tail 42a from the tip (tail feeding step). At this time, the clamper 44 is in the open state. The bonding tool position detection part 90 detects the height of the tip end of the bonding tool 40, and outputs information indicating the height (hereinafter referred to as height information) to the control part 80.

Further, at time t6, when the control part 80 acquires the height information indicating that the height of the bonding tool 40 is the height H1, it controls the Z drive mechanism 12 by the XYZ axis control part 82 to stop the operation of the bonding tool 40. At this time, as shown in FIG. 6F, the height of the tip end of the bonding tool 40 is the height H1, and the wire tail 42a is led out from the tip end of the bonding tool 40.

Figure 6G:
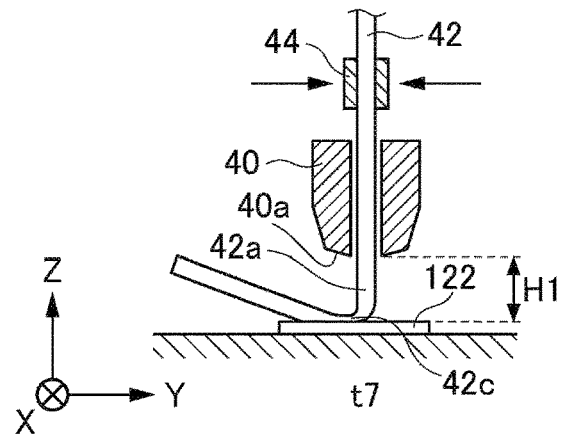
FIG. 6G is a view showing an example of an operation of closing a clamper.

At time t7, as shown in FIG. 6G, the wire bonding device 1 closes the clamper 44 and grips the wire 42. With the clamper 44 closed, at time t8, the wire bonding device 1 performs the tension applying step and the tension release step. As shown in FIG. 7, the wire bonding device 1 turns on the ultrasonic vibration in, for example, the tension applying step and the tension release step. Hereinafter, the tension applying step and the tension release step at time t8 will be described with reference to FIG. 8 as well.

Figure 6H:
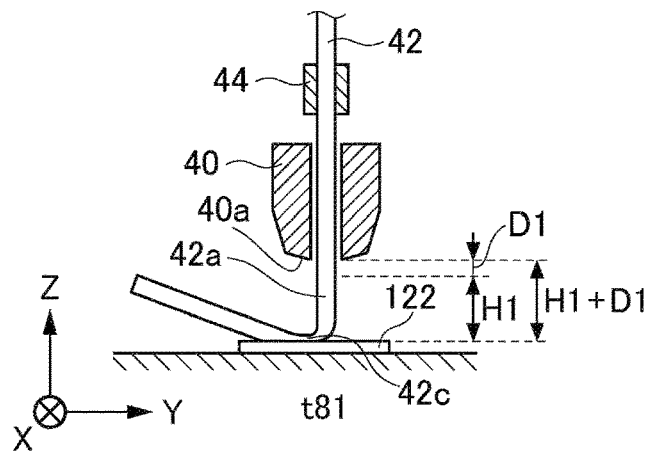
FIG. 6H is a view showing an example of an operation of a first tension applying step.

In step S16 (time t81 in FIG. 8), as shown in FIG. 6H, the wire bonding device 1 raises the tip end of the bonding tool 40 together with the clamper 44 to a predetermined height (here, height H1+D1) in the Z-axis direction while gripping the wire 42 with the clamper 44 (hereinafter referred to as the first tension applying step). In other words, the tip end of the bonding tool 40 is raised by a predetermined moving distance (here, the moving distance D1). As a result, the wire bonding device 1 may apply tension to the bonding end part 42c in the Z-axis direction. At this time, for example, when the control part 80 acquires the height information indicating that the height of the tip end of the bonding tool 40 is the height H1+D1, it controls the Z drive mechanism 12 by the XYZ axis control part 82 to stop the operation of the bonding tool 40 (clamper 44).

Figure 6I:
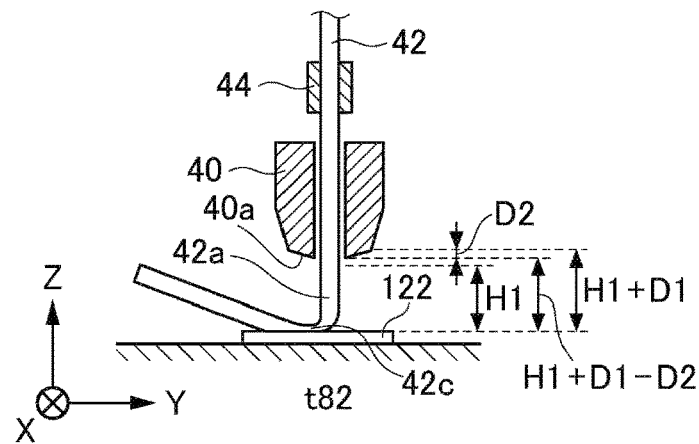
FIG. 6I is a view showing an example of an operation of a first tension release step.

In step S17 (time t82 in FIG. 8), as shown in FIG. 6I, the wire bonding device 1 lowers the wire tail 42a to a predetermined height (here, height H1+D1−D2) in the Z-axis direction (hereinafter referred to as the first tension release step). In other words, the tip end of the bonding tool 40 is lowered by a predetermined moving distance (here, the moving distance D2). As a result, the wire bonding device 1 may release the tension applied to the bonding end part 42c. At this time, for example, when the control part 80 acquires the height information indicating that the height of the tip end of the bonding tool 40 is the height H1+D1−D2, it controls the Z drive mechanism 12 by the XYZ axis control part 82 to stop the operation of the bonding tool 40 (clamper 44).

In step S18, the wire bonding device 1, for example, sets a moving amount indicating the height or moving distance of the bonding tool 40 for each of the next tension applying step (hereinafter referred to as the second tension applying step) and tension release step (hereinafter referred to as the second tension release step) with respect to the first tension applying step and the first tension release step. The wire bonding device 1 sets the moving amount of each step based on, for example, information (raising information, lowering information, and the like) regarding the moving amount stored in a predetermined storage part.

Here, the wire bonding device 1 sets, for example, the height of the second tension applying step to be higher than the height of the first tension applying step. Similarly, the wire bonding device 1 sets, for example, the height of the second tension release step to be higher than the height of the first tension release step. Further, the wire bonding device 1 may set the moving distance of the second tension applying step and the moving distance of the second tension release step to be equal to the moving distance of the first tension applying step and the moving distance of the first tension release step. Here, the "equal moving distance"

means, for example, a moving distance that allows a mechanical error of the wire bonding device 1 in two moving distances.

Figure 6J:
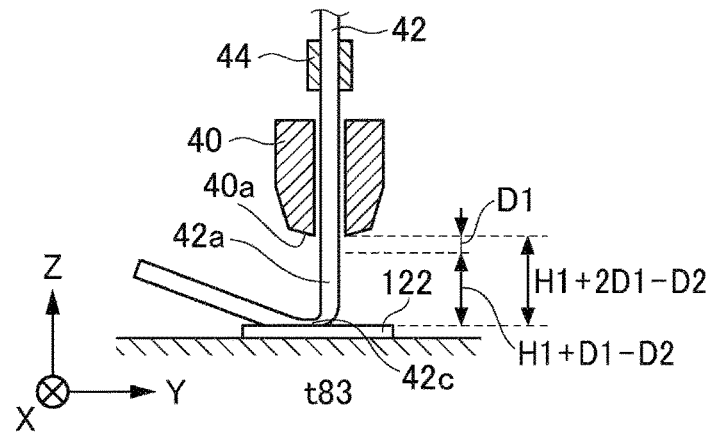
FIG. 6J is a view showing an example of an operation of a second tension applying step.

In step S19 (time t83 in FIG. 8), as shown in FIG. 6J, the wire bonding device 1 raises the tip end of the bonding tool 40 together with the clamper 44 to a predetermined height (here, height H1+2D1−D2) in the Z-axis direction while gripping the wire 42 with the clamper 44 in the second tension applying step. In other words, the tip end of the bonding tool 40 is raised by a predetermined moving distance (here, moving distance D1) starting from the end point (here, height H1+D1−D2) of the first tension release step. As a result, the wire bonding device 1 may apply tension to the bonding end part 42c in the Z-axis direction. At this time, for example, when the control part 80 acquires the height information indicating that the height of the tip end of the bonding tool 40 is the height H1+2D1−D2, it controls the Z drive mechanism 12 by the XYZ axis control part 82 to stop the operation of the bonding tool 40 (clamper 44).

Figure 6K:
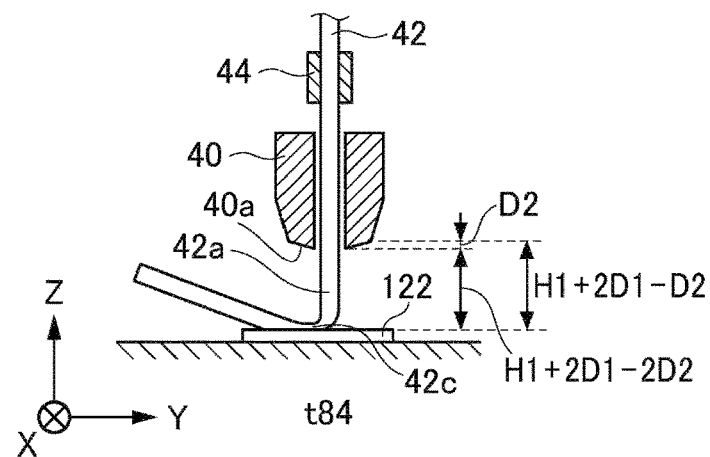
FIG. 6K is a view showing an example of an operation of a second tension release step.

In step S20 (time t84 in FIG. 8), as shown in FIG. 6K, the wire bonding device 1 lowers the wire tail 42a to a predetermined height (here, height H1+2D1−2D2) in the Z-axis direction in the second tension release step. In other words, the tip end of the bonding tool 40 is lowered by a predetermined moving distance (here, moving distance D2) starting from the end point (here, height H1+2D1−D2) of the second tension applying step. As a result, the wire bonding device 1 may release the tension applied to the bonding end part 42c. At this time, for example, when the control part 80 acquires the height information indicating that the height of the tip end of the bonding tool 40 is the height H1+2D1−2D2, it controls the Z drive mechanism 12 by the XYZ axis control part 82 to stop the operation of the bonding tool 40 (clamper 44).

In step S21, the wire bonding device 1 determines whether the wire tail 42a has been cut. Specifically, the wire bonding device 1 determines that the wire tail 42a has been cut when the electric signal is not detected by the detection part 70 (step 521: YES). In this case, the wire bonding device 1 ends the process for cutting the wire tail 42a. On the other hand, the wire bonding device 1 determines that the wire tail 42a is not cut when the electric signal is detected by the detection part 70 (step 521: NO). In this case, the wire bonding device 1 proceeds the process to step S18.

Further, in the above description, only the first and second tension applying steps and the first and second tension release steps have been described as shown at time t81 to time t84, but as shown at times t85 and t86 in FIG. 8, the tension applying step and the tension release step are repeated until the electric signal is no longer detected by the detection part 70.

By repeating the tension applying step and the tension release step in this way, as shown in FIG. 8, tension is applied to the wire tail 42a stepwise by multiple tension applying steps, and the bonding tool 40 can be operated without applying excessive tension to the wire tail 42a. As a result, the connection part between the wire tail 42a and the bonding point (here, the bonding end part 42c) is gradually thinned, and the wire tail 42a may be cut with a small pulling force at the time of cutting.

Figure 6L:
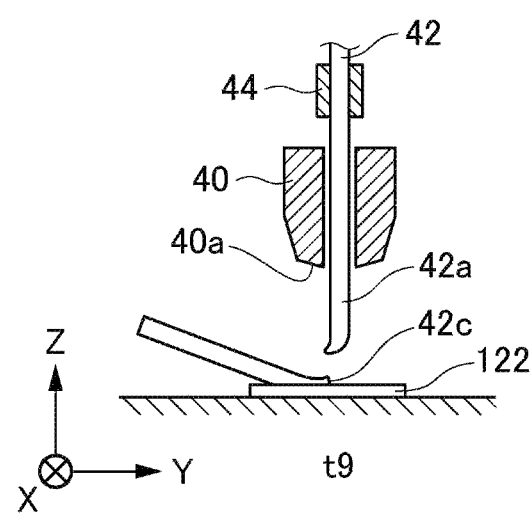
FIG. 6L is a view showing an example of a state in which a wire tail is cut.

As shown in FIG. 6L, in the wire bonding device 1, when the wire tail 42a is cut, as shown in the graph (OFF) of the "electric signal" shown in FIG. 7, it is determined that the electric signal is not detected by the detection part 70, and the tension applying step and the tension release step are ended.

Modified Example

Figure 9:
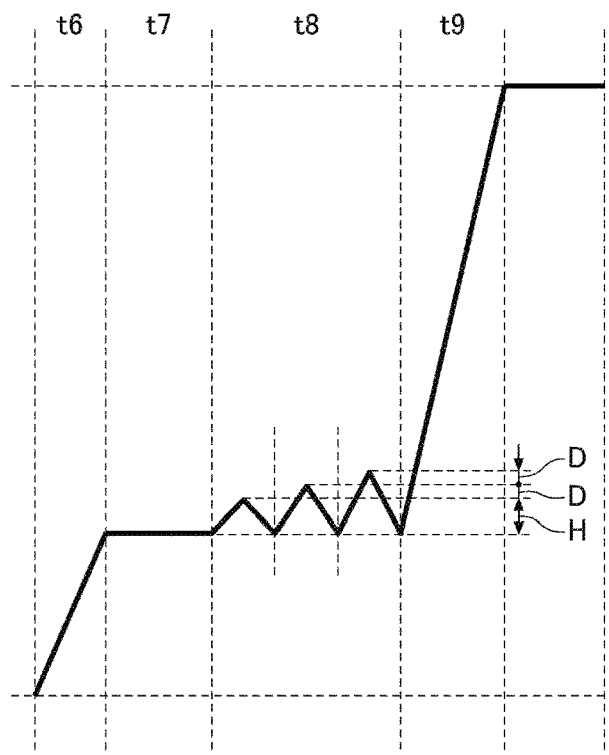
FIG. 9 is another example of a detailed timing chart of the tension applying step and the tension release step.

In the above, as shown in FIG. 8, the operation of the wire bonding device 1 has been described in which the moving distance of the first tension applying step and the moving distance of the first tension release step are set to be equal, but the disclosure is not limited thereto. FIG. 9 is a timing chart showing another example of the tension applying step and the tension release step. As shown in FIG. 9, in the wire bonding device 1, for example, the setting may be adopted as long as the height of the second tension applying step (height H+D in FIG. 9) is higher than the height of the first tension applying step (height H in FIG. 9). That is, the height of the second tension release step may be equal to the height of the first tension release step. Furthermore, the height of the second tension release step and the height of the first tension release step may be substantially equal to the height of the second bonding point. This simplifies the processing for the lowering moving amount in the tension release step, and thus improves the processing speed of the system.

Figure 10:
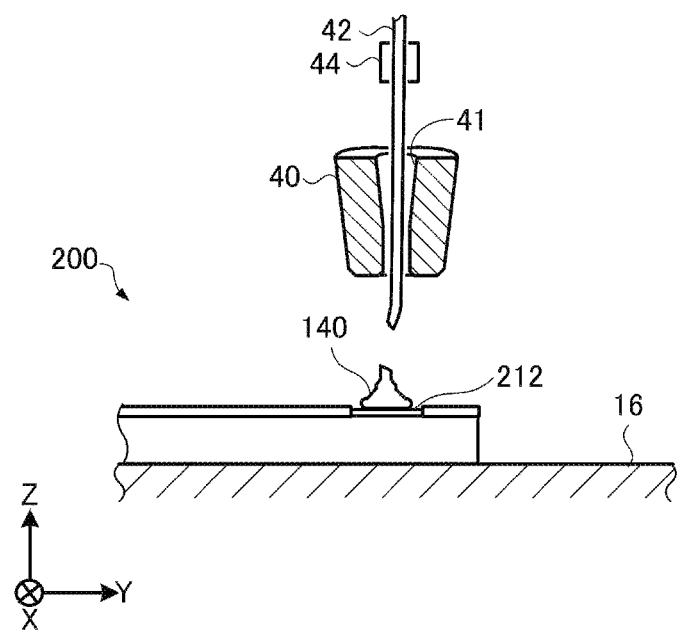
FIG. 10 is a view showing another example of the wire bonding method.

In the above, as an example of the wire bonding method, wire bonding for connecting two points of the bonding target by a wire has been described, but the disclosure is not limited thereto. For example, the above embodiment may be applied to a method of forming the bump 140 on the electrode 212 which is the bonding point of the semiconductor device 200 in the bump bonding shown in FIG. 10. In this case, the steps S10 to S14 may be omitted from the flowchart of FIG. 5. Further, for example, the above embodiment may be applied to wedge bonding. In this case, the step S10 may be omitted from the flowchart of FIG. 5.

In the above, it has been described that the wire bonding device 1 determines whether the wire tail 42a has been cut after the second tension release step (step S20), but the disclosure is not limited thereto. The wire bonding device 1 may determine whether the wire tail 42a has been cut after the second tension applying step (step S19), or may constantly determine whether the wire tail 42a has been cut. As a result, it may be determined whether the wire tail 42a has been cut without delay, so that the operation related to the cutting of the wire tail 42a of the wire bonding device 1 may be reduced.

In the above, it has been described that in the wire bonding device 1, the clamper 44 is closed in the tension release step, but the disclosure is not limited to this. In the tension release step, the clamper 44 may be open. This facilitates the operation of releasing the tension of the wire 42.

The embodiments described through the embodiments of the disclosure may be appropriately combined, modified or changed according to the intended use, and the disclosure is not limited to the description of the above-described embodiments. It is clear from the description of the claims that such combinations or modifications or changes may also be included in the technical scope of the disclosure.

What is claimed is:

1. A wire bonding device for performing a wire bonding process, the wire bonding device comprising:
   a bonding tool including an insertion hole adapted for a wire to be inserted, the bonding tool configured to be movable;
   an ultrasonic vibrator for supplying ultrasonic vibration to the bonding tool via an ultrasonic horn;
   a control part, comprising one or more processors for controlling the wire bonding process, wherein the control part is configured to perform:
a bonding step of bonding the wire to a bonding surface of a bonding point by pressing the wire with the bonding tool;
a tail feeding out step of feeding out a wire tail from the wire bonded to the bonding point;
a tension applying step of raising the bonding tool normal to the bonding surface to apply tension to the wire while the wire is clamped;
a tension release step of lowering the bonding tool normal to the bonding surface to release the tension applied to the wire; and
a tail cutting step of raising the bonding tool to cut the wire tail from the wire bonded to the bonding point, the tension applying step and the tension release step are performed consecutively for a plurality of times before the tail cutting step is performed.

2. The wire bonding device according to claim 1, wherein the tension applying step comprises a first tension applying step and a second tension applying step performed after the first tension applying step,
the tension release step is performed between the first tension applying step and the second tension applying step, and
a raising moving amount of the bonding tool in the second tension applying step is greater than a lowering moving amount of the bonding tool in the tension release step.

3. The wire bonding device according to claim 2, wherein the raising moving amount of the bonding tool in the first tension applying step is equal to the raising moving amount of the bonding tool in the second tension applying step.

4. The wire bonding device according to claim 2, wherein the raising moving amount of the bonding tool in the first tension applying step is equal to the lowering moving amount of the bonding tool in the tension release step.

5. The wire bonding device according to claim 1, wherein the control part further performs:
a first bonding step of bonding the wire at a tip end of the bonding tool to a first bonding point; and
after performing the first bonding step, a wire loop step of looping the wire from the first bonding point toward a second bonding point, which is the bonding point.

6. The wire bonding device according to claim 1, wherein the bonding step comprises forming the wire at a tip end of the bonding tool in a ball shape and bonding the wire formed in the ball shape to the bonding point.

7. The wire bonding device according to claim 1, further comprising a detection part for detecting that the wire tail has been cut at the bonding point based on an electric signal supplied to the clamped wire,
wherein when the detection part detects that the wire tail has been cut at the bonding point, the control part stops performing the tension applying step and the tension release step.

8. The wire bonding device according to claim 1, wherein a raising moving amount in the tension applying step and a lowering moving amount in the tension release step are set by a predetermined ratio with respect to a thickness of the wire.

9. A wire cutting method performed by using a wire bonding device for performing a wire bonding process,
wherein the wire bonding device comprises:
a bonding tool including an insertion hole adapted for a wire to be inserted, the bonding tool configured to be movable;
an ultrasonic vibrator for supplying ultrasonic vibration to the bonding tool via an ultrasonic horn;
a control part, comprising one or more processors for controlling the wire bonding process, and
the wire cutting method comprises:
a bonding step of bonding the wire to a bonding surface of a bonding point which is by pressing the wire with the bonding tool;
a tail feeding out step of feeding out a wire tail from the wire bonded to the bonding point;
a tension applying step of raising the bonding tool normal to the bonding surface to apply tension to the wire while the wire is clamped;
a tension release step of lowering the bonding tool normal to the bonding surface to release the tension applied to the wire; and
a tail cutting step of raising the bonding tool to cut the wire tail from the wire bonded to the bonding point, the tension applying step and the tension release step are performed consecutively for a plurality of times before the tail cutting step is performed.

10. A non-transitory computer-readable recording medium storing a program for causing a wire bonding device to perform a wire bonding process,
wherein the wire bonding device comprises:
a bonding tool including an insertion hole adapted for a wire to be inserted, the bonding tool configured to be movable;
an ultrasonic vibrator for supplying ultrasonic vibration to the bonding tool via an ultrasonic horn;
a control part, comprising one or more processors for controlling the wire bonding process, and
the program causes the wire bonding device to perform:
a bonding step of bonding the wire to a bonding surface of a bonding point by pressing the wire with the bonding tool;
a tail feeding out step of feeding out a wire tail from the wire bonded to the bonding point;
a tension applying step of raising the bonding tool normal to the bonding surface to apply tension to the wire while the wire is clamped;
a tension release step of lowering the bonding tool normal to the bonding surface to release the tension applied to the wire; and
a tail cutting step of raising the bonding tool to cut the wire tail from the wire bonded to the bonding point, the tension applying step and the tension release step are performed consecutively for a plurality of times before the tail cutting step is performed.

* * * * *